US005557580A

United States Patent [19]
Numaga et al.

[11] Patent Number: 5,557,580
[45] Date of Patent: Sep. 17, 1996

[54] WORD LINE DRIVING CIRCUIT

[75] Inventors: Shigeki Numaga, Ami-machi; Shunichi Sukegawa, Tsukuba; Takashi Inui, Tshuchiura; Yukihide Suzuki, Akishima; Kiyoshi Nakai, Ohme, all of Japan

[73] Assignees: Texas Instruments Incorporated, Dallas, Tex.; Hitachi, Ltd., Japan

[21] Appl. No.: 292,452

[22] Filed: Aug. 18, 1994

[30] Foreign Application Priority Data

Aug. 18, 1993 [JP] Japan ................................. 5-225095

[51] Int. Cl.$^6$ ................................. G11C 8/00; G11C 7/00
[52] U.S. Cl. .......................... 365/230.06; 365/189.09; 365/189.11; 365/194
[58] Field of Search ................ 327/108, 51; 365/230.06, 365/189.09, 189.11, 194

[56] References Cited

U.S. PATENT DOCUMENTS

| | | | |
|---|---|---|---|
| 5,305,279 | 4/1994 | Park et al. | 365/230.06 |
| 5,351,217 | 9/1994 | Jeon | 365/230.06 |
| 5,363,338 | 11/1994 | Oh | 365/230.06 |
| 5,412,331 | 5/1995 | Jun et al. | 365/230.06 |

Primary Examiner—David C. Nelms
Assistant Examiner—Trong Phan
Attorney, Agent, or Firm—William E. Hiller; Richard L. Donaldson

[57] ABSTRACT

A word line driving circuit which effectively prevents ground noise during word line discharge along with accommodating the narrowing of pitch in the word lines by making the layout area of the word line driver small. The word line driving circuit includes n-type MOS transistor 14 and p-type MOS transistor 12. The drain terminal of n-type MOS transistor 14 and drain terminal of p-type MOS transistor 12 in word line driver 10 are connected to the base terminal of word line WLi. The output terminal of an output transistor driving circuit 16 is connected to the source terminal of p-type MOS transistor 12, and the output terminal of a first output transistor controlling circuit 18 is connected to the gate terminal. The output terminal of a second output transistor controlling circuit 20 is connected to the gate terminal of n-type MOS transistor 14, and a ground terminal 22 as a reference potential terminal for leading in the electric current is connected to the source terminal.

6 Claims, 5 Drawing Sheets

WORD LINE DRIVING CIRCUIT

The present invention relates to a word line driving circuit which drives the word line in a memory array of a semiconductor memory device.

BACKGROUND OF THE INVENTION

Generally, in a memory array of a DRAM (dynamic random access memory), one memory cell MCij is arranged (connected) at the intersecting position of bit line BLj provided in each column and word line WLi provided in each row, as seen in FIG. 6. Each memory cell MCij comprises one n-type MOS transistor TRij and one capacitor Cij. Each word line WLi is connected to word line driving circuit WDi in each row and each bit line BLj is connected to sense amplifier SAj in each column.

The executing writing in memory cell MCij, word line driving circuit WDi turns on transistor TRij by driving or activating word line WLi to the potential of the H level, and simultaneous to this, sense amplifier SAj moves the potential of bit line BLj into H level (VDD) or L level (VSS) according to the write information ("1" or "0"). In this way, charge voltage of VDD or VSS is obtained in capacitor Cij. Thereafter, word line driving circuit WDi drops word line WLi to the L level (VSS) and turns off transistor TRij. As a result, charging voltage or charge of "1" (VDD) or "0" (VSS) is maintained as memory information in capacitor Cij.

When executing reading, sense amplifier SAj precharges bit line BLj to a fixed potential (generally VDD/2) beforehand, and word line driving circuit WDi turns on transistor TRij by driving or activating word line WLi to the H level. Consequently, bit line BLj and capacitor Cij are short circuited, and the potential on bit line BLj changes slightly from the precharged level according to the stored charge in capacitor Cij. By sense amplifier SAj detecting and amplifying the slight potential change on said bit line BLj, the memory information in memory cell MCij is identified.

In order to reliably turn on an n-type MOS transistor TRij of a memory cell MCij in this type of memory array, it is necessary to give consideration to the substrate bias effect and threshold voltage VTN and make the H level of word line WLi into potential VPP (normally VDD+2VTN) which is higher than the power source voltage VDD. The threshold voltage VTN of the n-type MOS transistor is about 0.8 V so in a 3.3-V operation type DRAM which will become the mainstream in the future, a drive voltage VPP of about 5.0 (3.3+2×0.8) becomes necessary.

Consequently, the self increasing system was conventionally used which increases power source voltage VDD individually to VPP by installing a bootstrap circuit in the word line driving circuit, but in recent years, the internal power source system is being used more, which feeds output voltage VPP of voltage pump circuit as the driving power source voltage to each word line driving circuit by installing a voltage pump circuit, which constantly generates drive voltage VPP at the peripheral part of the memory array.

In FIG. 7, the configuration of a conventional word line driving circuit according to the internal power source system is shown. In this word line driving circuit, p-type MOS transistor 102 and n-type MOS transistor 104 comprises a word line driver 100 which is connected to the base terminal of each word line WLi. Namely, along with the drain terminal p-type MOS transistor 102 being connected to the base terminal of word line WLi, the drain terminal of n-type MOS transistor 104 is connected via n-type MOS transistor 116.

The source terminal of p-type MOS transistor 102 is connected to driving power source voltage terminal 106, and the gate terminal is connected to the output terminal of drive controlling circuit 108. The source terminal of n-type MOS transistor 102 is connected to ground terminal 110, and the gate terminal is connected to the output terminal of discharge controlling circuit 112. The input terminals of discharge controlling circuit 112 and drive controlling circuit 108 are connected to the output terminal of address decoder 114. Row address signal AX from address bus (not shown in the figure) is input into the input terminal of address decoder 114. Driving power source voltage VPP from voltage pump circuit (not shown in the figure) is being constantly fed to driving power source voltage terminal 106. Driving power source voltage VPP is also provided to drive controlling circuit 108. n-type MOS transistor 116 is a circuit for hot electron prevention as will be discussed later, power source voltage VDD is provided to the gate terminal, and is always in the on state.

When word line WLi is in the inactive (standby) state, the output voltage of drive controlling circuit 108 is the H level (VPP), p-type MOS transistor 102 is in the off state, the output voltage of discharge control circuit 112 is the H level (VDD), and n-type MOS transistor 104 is in the on state.

When driving word line WLi in order to write or read, along with the output voltage of drive controlling circuit 108 becoming the L level (VSS) in response to the output signal from address decoder 114, the output voltage of discharge controlling circuit 112 becomes the L level (VSS). In this way, along with p-type MOS transistor 102 taking on the on state, n-type MOS transistor 104 takes on the off state, electric current flows into word line WLi from driving power source voltage terminal 106 through p-type MOS transistor 102, and the potential of word line WLi is raised to VPP.

If writing or reading ends, along with the output voltage of drive controlling circuit 108 becoming the H level (VPP), the output voltage of discharge controlling circuit 112 becomes H level (VDD) in order to return word line WLi into the inactive state. In this way, along with p-type MOS transistor 102 taking on the off state, n-type MOS transistor 104 takes on the on state, and the charge on word line WLi flows into the ground terminal 110 side through n-type MOS transistors 116 and 104. As a result, the potential on word line WLi returns to L level (VSS) again.

When discharging word line WLi and returning to the inactive state (L level) after driving word line WLi as noted above, there is a fear of hot electrons being generated and the characteristics of n-type MOS transistor 104 deteriorating due to voltage of VPP being applied to n-type MOS transistor 104 and large electric current with a strong electric field flowing between the gate and source when n-type MOS transistor 116 is not provided. Therefore, the voltage applied to n-type MOS transistor 104 is suppressed to be low by inserting n-type MOS transistor 116 that is always turned on and is generating a drop in voltage.

However, the pitch of the word line becomes narrower as integration of the DRAM increases; thus, it is not possible to avoid the area of word line drive circuit 100 from becoming small. Therefore, the installation of n-type MOS transistor 116 for hot electron prevention in each word line driver 100 becomes very difficult in the layout of the circuit design.

Furthermore, in the conventional word line driving circuit, all the charge on word line WLi flows into ground terminal 10 energetically through n-type MOS transistor 104 during the discharge of word line WLi, but there is a tendency for the charge or electric current which flowed into said ground terminal 10 energetically to flow into adjacent word lines WLi−1 and WLi+1 as so-called ground noise through n-type MOS transistor 104 which is in the on state in the adjacent word line driver 100; thus, there was a fear of causing erroneous operation.

It is an object of the present invention to provide a word line driving circuit which accommodates for the narrowing pitch of the word lines with margin by making the layout area of the word line driver small along with eliminating the fear of creating ground noise.

SUMMARY OF THE INVENTION

In accordance with the invention, a first word line driving circuit comprises a first output transistor which has a first terminal connected to the word line, a second output transistor which has a second terminal connected to a reference potential terminal for leading in electric current and a first terminal connected to the word line, an output transistor driving circuit, which is connected to the second terminal of the first output transistor, which provides power voltage for driving the word line to the second terminal of the first output transistor during the time the word line is driven, and which decreases the potential of the second terminal of the first transistor to the potential for leading in electric current after driving of the word line is ended, a first output transistor controlling circuit, which is connected to the control terminal of the first output transistor, which turns on the first output transistor in order to drive the word line, and which returns the first output transistor into the off state after the first prescribed time from the end of driving the word line, and a second output transistor controlling circuit, which is connected to the control terminal of the second output transistor, which moves the second output transistor into the off state during the time the word line is being driven, and turns on the second output transistor after the second prescribed time from the end of driving the word line.

Also, in a further aspect of the invention, an embodiment of the word line driving circuit has a p-type MOS transistor in which the drain terminal is connected to the word line, an n-type MOS transistor in which the drain terminal is connected to the word line and the source terminal is connected to the reference potential terminal, an output transistor driving circuit which is connected to the source terminal of the p-type MOS transistor, provides a prescribed power voltage for driving the word line to the source terminal of the p-type MOS transistor during the time the word line is driven, and decreases the potential of the source terminal of the p-type MOS transistor to the potential for leading in electric current after driving of the word line is completed, a first output transistor controlling circuit, which is connected to the gate terminal of the p-type MOS transistor, which turns on the p-type MOS transistor in order to drive the word line, and which returns the p-type MOS transistor to the off state after the first prescribed time from which driving of the word line ends, and a second output transistor controlling circuit, which is connected to the gate terminal of the n-type MOS transistor, which makes the n-type MOS transistor into the off state during the time the word line is being driven, and which turns on the n-type MOS transistor after the second prescribed time from which driving the word line ends.

When activating or driving the word line, the second output transistor takes on the off state, the first output transistor takes on the on state, electric current flows into the word line via the first output transistor in the on state, and the word line is charged to the driving power source voltage level. In the present invention, when discharging the driven or activated word line, first of all, the output transistor driving circuit reduces the potential in the second terminal of the first output transistor to the potential for leading in the electric current into the first output transistor left in the on state and the second output transistor left in the off state. In this way, the charge on the word line is discharged to the output transistor driving circuit side through the first output transistor, which is still in the on state. In this way, the second output transistor is turned on when the potential of the word line drops to a given level (after the second prescribed time) from the driving power source voltage level. From this point in time, the word line is discharged through the second output transistor which is in the on state.

Figure 1:
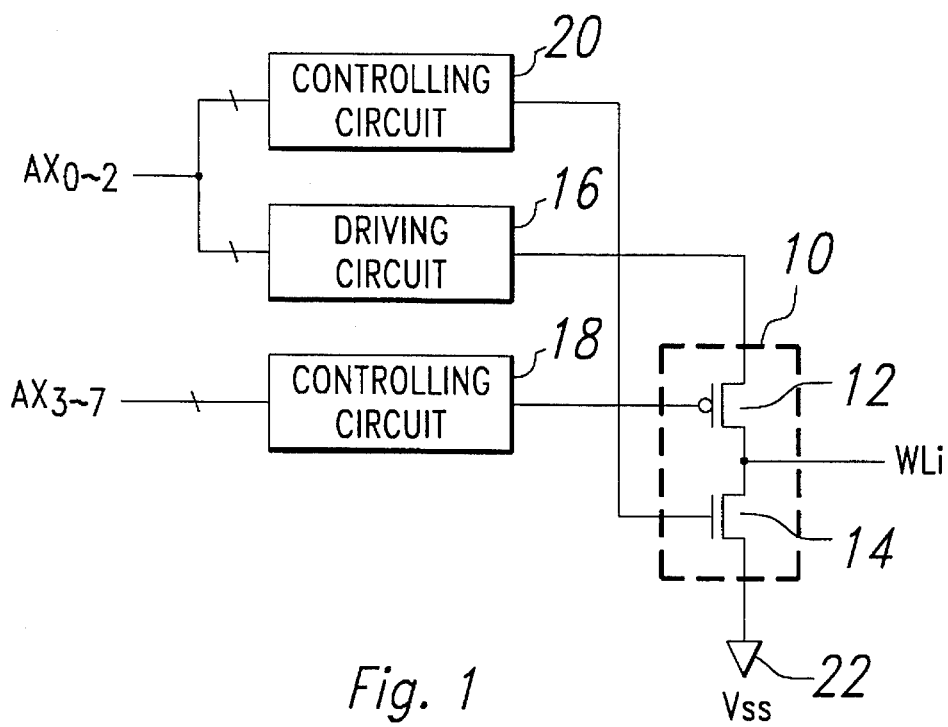
FIG. 1 is a block diagram showing a word line driving circuit according to one embodiment of the present invention.

Reference numerals and symbols as shown in the drawings:

(10) . . . word line driver, (12) . . . p-type MOS transistor (first output transistor), (14) . . . n-type MOS transistor (second output transistor), (16) . . . output transistor driving circuit, (18) . . . first output transistor controlling circuit, (20) . . . second output transistor controlling circuit, (36) . . . driving power source voltage terminal, (22) . . . ground terminal (reference potential terminal), (40) . . . ground terminal, (WLi) . . . word line.

DESCRIPTION OF THE PREFERRED EMBODIMENTS

FIG. 1 shows a word line driving circuit according to one embodiment of the present invention. In this word line driving circuit, p-type MOS transistor 12 and n-type MOS transistor 14 are the first and second output transistors and comprise word line driver 10 connected to the base terminal of each word line WLi. Therefore, the drain terminal of p-type MOS transistor 12 and the drain terminal of n-type MOS transistor 14 are connected to the base terminal of word line WLi.

The output terminal of output transistor driving circuit 16 is connected to the source terminal of p-type MOS transistor 12, and the output terminal of first output transistor controlling circuit 18 is connected to the gate terminal. The output terminal of second output transistor controlling circuit 20 is connected to the gate terminal of n-type MOS transistor 14, and ground terminal 22 as the reference potential terminal for leading in the electric current is connected to the source terminal.

The three low-order bits AX0–2 from, for example, the 8 bit row address signals AX0–7 from the address bus (not shown in the figures) are input into the input terminals of second output transistor controlling circuit 20 and output transistor driving circuit 16, and the five high-order bits AX3–7 of the row address signals AX0–7 are input into the input terminal of first output transistor controlling circuit 18. In the word line driving circuit of this embodiment, the internal power source system is used and in addition to reference power source voltage VDD (e.g., 3.3 V) from the external power source being fed to each part 16, 18, and 20, driving power source voltage VPP (e.g., 5.0 volts) is fed from voltage pump circuit (not shown in the figures) to first output transistor controlling circuit 18 and output transistor driving circuit 16.

Figure 3:
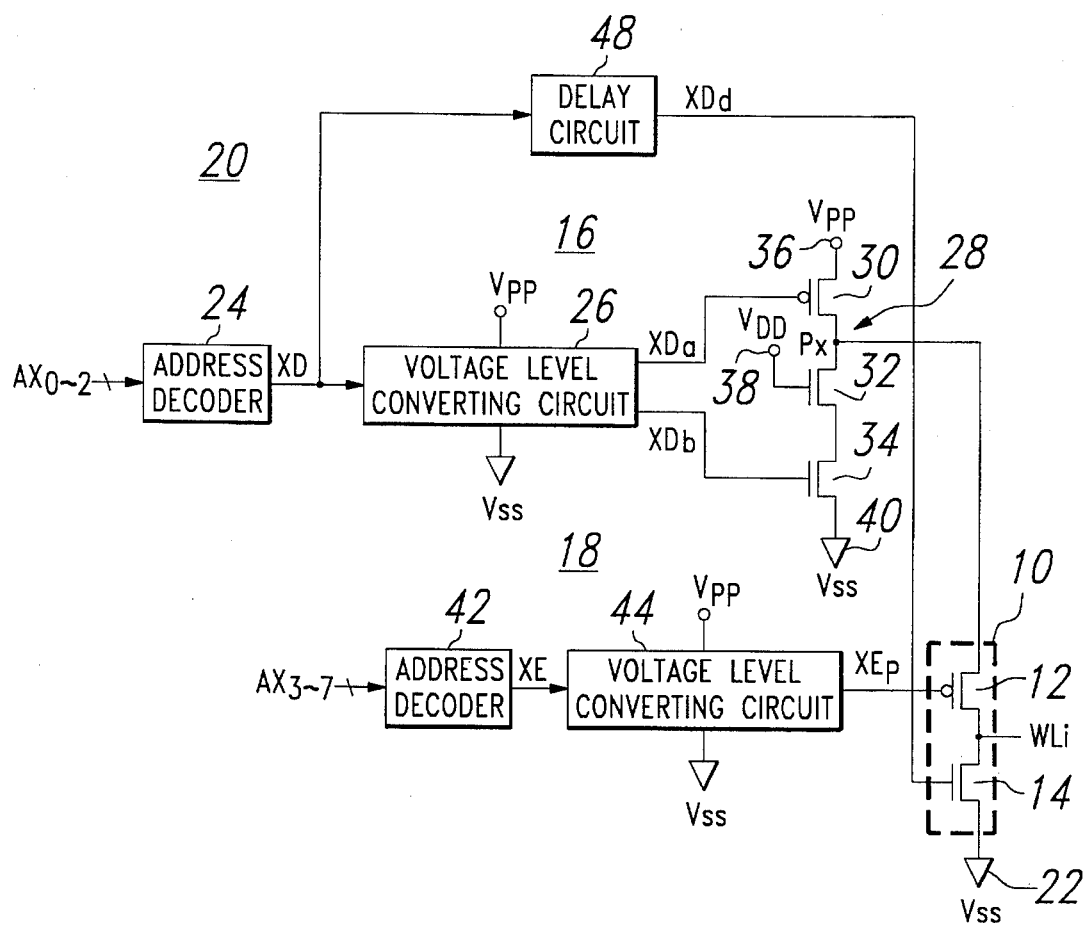
FIG. 3 is a block diagram showing a word line driving circuit according to an embodiment of the invention.

FIG. 3 is a circuit configuration showing a basic constitutional example of each part 16, 18, and 20 of the word line driving circuit in this embodiment.

Output transistor driving circuit 16 comprises address decoder 24, voltage level converting circuit 26, and switch circuit 28. Address decoder 24 drops output signal XD from H level (VDD) to L level (VSS) at a prescribed timing in response to a prescribed strobe signal (not shown in the figures) such as RAS signal, etc., when the logical value of the three low-order bits AX0–2 of input row address signals volts) AX0–7 is a value corresponding to the row of word line WLi, and returns output signal XD to the H level (VDD) after a prescribed time (at completion of word line drive). The switch circuit 28 includes p-type MOS transistor 30 and n-type MOS transistors 32, 34. Transistors 32,34 are connected in series to ground potential (VSS) via terminal 40. In this switch circuit 28, n-type MOS transistor 32 has its gate terminal receiving power source voltage VDD, and it usually is on. When the first output signal XDa of voltage level converting circuit 26 is at the VPP level, while the second output signal XDb is on the VDD level (when the output signal XD of address decoder 24 is at H level (VDD)), p-type MOS transistor (30) of switch circuit 28 becomes off, and n-type MOS transistor 34 becomes on. Output terminal Px is connected to ground 34 becomes on. Output terminal Px is connected to ground potential (VSS) through n-type MOS transistors 32, 34 turned on. P-type MOS transistor 30 of switch circuit 28 is in the on state when first output signal XDa and second output signal XDb of voltage level converting circuit 26 are at the VSS level (when output signal XD of address decoder 24 is the L level (VSS)), n-type MOS transistor 34 takes on the off state, and output terminal PX is connected to driving power voltage VPP via p-type MOS transistor 30, which is in the on state. The voltage or potential of output terminal PX is provided to the source terminal of p-type MOS transistor 12 in word line driver (10).

First output transistor controlling circuit 18 is composed of address decoder 42 and voltage level converting circuit 44. Address decoder 42 drops output signal XE from H level (VDD) to L level (VSS) at a prescribed timing (at the start of driving the word line) in response to a prescribed strobe signal such as RAS signal, etc., when the logical value of the five high-order bits AX3–7 of input row address signals AX0–7 is a value corresponding to the row of word line WLi, and returns output signal XE to H level (VDD) after a prescribed time (time delayed by just prescribed time tB from end of driving the word line). Voltage level converting circuit 44 has one input terminal which inputs output signal XE of address decoder 42 and one output terminal which generates output signal XEp of binary voltage levels (VPP) and (VSS). When output signal XE from address decoder 42 is the H level (VDD), output signal XEp of VPP level is obtained in the output terminal of voltage level converting circuit 44, and output signal XEp of VSS level is obtained in the output terminal of voltage level converting circuit 44 when XE is the L level (VSS). Output signal XEp of voltage level converting circuit 44 is provided to the gate terminal of p-type MOS transistor 12 in word line driver 10 as the output signal of the first output transistor controlling circuit 18.

Second output transistor controlling circuit 20 includes a delay circuit 48 for receiving the output from the address decoder 24. As noted above, address decoder 24 drops output signal XD to the L level (VSS) at a prescribed timing (when driving of the word line starts) when the logical value of input address bits AX0–2 is a value corresponding to the row of word line WLi, and returns output signal XD to the H level (VDD) after a prescribed time (at the end of driving the word line). Delay circuit 48 is constituted to output the input signal by delaying by just prescribed time tA when the input signal builds up from L level (VSS) to H level (VDD), and to output the input signal as is (without delaying) when the input signal builds down from H level (VDD) to L level (VSS). Consequently, when output signal XD of address decoder 24 builds up from L level (VSS) to H level (VDD), output signal XDd of delay circuit 48 builds up from L level (VSS) to H level (VDD) by being delayed by just prescribed time tA, and when XD builds down from H level (VDD) to L level (VSS), output signal XDd of delay circuit 48 builds down from H level (VDD) to L level (VSS) simultaneously. Output signal VDd of delay circuit 48 is provided to the gate terminal of n-type MOS transistor 14 in word line driver 10 as an output signal of second output transistor controlling circuit 20.

Figure 2:
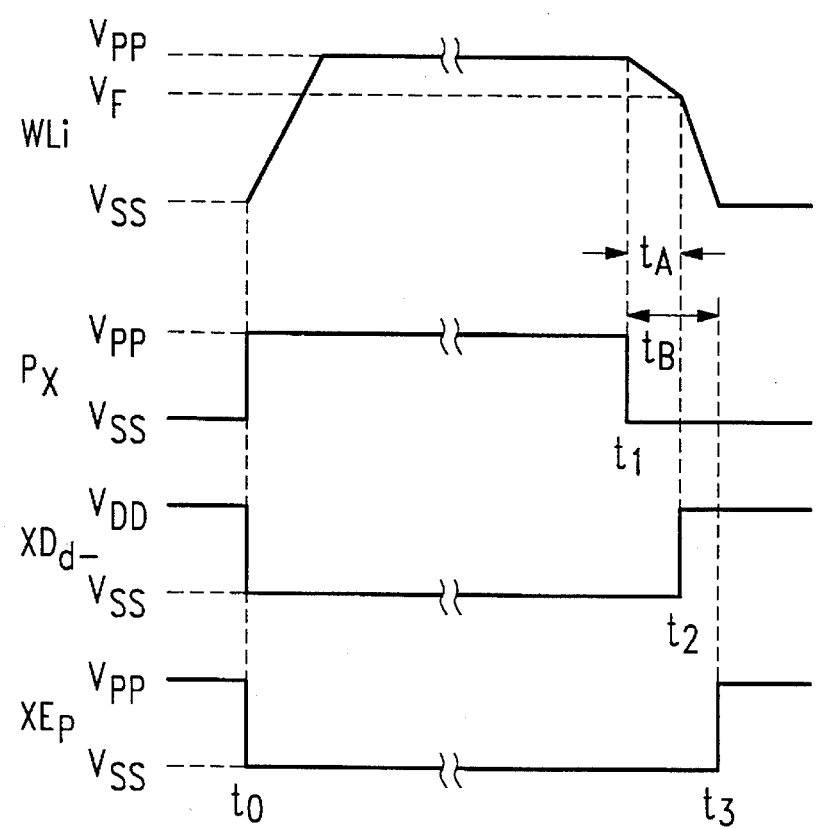
FIG. 2 is a waveform diagram of the voltage or potential in each part for explaining the operation of the word line driving circuit according to an embodiment of the invention.

Next, the operation of the word line driving circuit in this application example will be explained according to FIG. 2. When address signals AX0–7 specifying the row of word line WLi are input at timing t0, output signals XD and XE of both address decoders 24 and 42 build down from H level (VDD) to L level (VSS). Then, in output transistor driving circuit 16, output signals XDa and XDb of L level (VSS) are obtained in first and second output terminals of voltage level converting circuit 26, p-type MOS transistor 30 is turned on, and n-type MOS transistor 34 is turned off. In this way, output terminal PX is connected to driving power source voltage (VPP) via p-type MOS transistor 30 which is on. In first output transistor driving circuit 18, output signal XEP of voltage level converting circuit 44 builds down from H level (VPP) to L level (VSS) in response to output signal XE of address decoder 42 having reduced from H level (VDD) to L level (VSS) at timing t0. Also, in second output transistor driving circuit 20, output signal XDd of delay circuit 48 comes down from H level (VPP) to L level (VSS) simultaneously with the coming down of output signal XDd of address decoder 24 from H level (VDD) to L level (VSS) at timing t0.

As a result, in word line driver 10, simultaneous with n-type MOS transistor 14 taking on the off state, p-type MOS transistor 12 turns on, and driving power source voltage VPP is provided to the source terminal of p-type MOS transistor 12 from output terminal PX of output transistor driving circuit 16. In this way, electric current flows into word line WLi through p-type MOS transistor 12 which is in the on state, and word line WLi is charged to the VPP level. By word line WLi being thus driven or activated to the VPP level, the n-type MOS transistors in all memory cells (not shown in the figures) connected to said word line WLi turn on. Driving power source voltage VPP is impressed between the source and drain of transistor 12 right after start of driving word line WLi, but hot electrons are not generated due to being a p-type MOS.

When the memory access ends and becomes timing tt for ending the driving of word line WLi, output signal XD of address decoder 24 builds up from L level (VSS) to H level (VDD). In this way, in output transistor driving circuit 16, output signals XDa and XDb of H levels (VPP) and (VDD) are obtained respectively in the first and second output terminals of voltage level converting circuit 26, p-type MOS transistor 30 takes on the off state, and n-type MOS transistor 34 takes on the on state. In this way, output terminal PX is connected to the ground potential via n-type MOS transistors 32 and 34 which are in the on state. However, at this point in time (timing t1), output signals XEP and XDd of first and second output transistor controlling circuits 18 and 20 are still in the L level (VSS), p-type MOS transistor 12 is left in the on state in word line driver 10, and n-type MOS transistor 14 is left in the off state.

Therefore, when output terminal PX of output transistor driving circuit 16 is connected to the ground potential via n-type MOS transistors 32 and 34 which are in the on state at timing t1, charge on word line WLi is lead into the ground terminal 40 side through n-type MOS transistors 32 and 34 and p-type MOS transistor 12 which are in the on state, and in this way, the potential of word line WLi starts to come down from the VPP level. At this time, voltage of only that which subtracts the voltage drop in p-type MOS transistor 12 and n-type MOS transistor 32 from voltage (VPP) of word line WLi is impressed between the source and drain of n-type MOS transistor 34, so there is no fear of hot electrons being generated in n-type MOS transistor 34.

At the point in time (timing t2) in which just prescribed time tA lapsed from timing t1, output signal XDd of second output transistor controlling circuit 20 builds up from L level (VSS) to H level (VDD) and n-type MOS transistor 14 of word line driver 10 takes on the on state. In this way, the charge on word line WLi flows into the ground terminal 22 side through n-type MOS transistor 14, which is on.

In this embodiment, the potential of word line WLi has already dropped to a relatively low level VF (e.g., near 3.0 V) from the VPP level when said n-type MOS transistor 14 is turned on at timing t2 so excessive voltage is not impressed between the source and drain of said transistor 14. Therefore, there is no fear of hot electrons being generated and n-type MOS transistor 14 operates stably.

Also, when timing t2 lapses, the charge existing on word line WLi at the end of the drive (timing t1) is divided and lead into ground terminal 22 on the word line driver 10 side and ground terminal 40 on the output transistor driving circuit 16 side so the charge or the electric current quantity flowing into ground terminal 22 on the word line driver 10 side is reduced to half of that in the conventional technology. Consequently, there is no fear of the charge or electric current that flowed into ground terminal 22 flowing into the adjacent word line drivers due to excess energy. Therefore, there is no fear of generating ground noise.

Output signal XEP of first output transistor controlling circuit 18 builds up from L level (VSS) to H level (VPP) at timing t3 in which prescribed time tB lapsed from end of the drive (timing t1), and in this way, p-type MOS transistor 12 of word line driver 10 takes on the off state. In this way, said word line driving circuit returns to the standby state.

Figure 4:
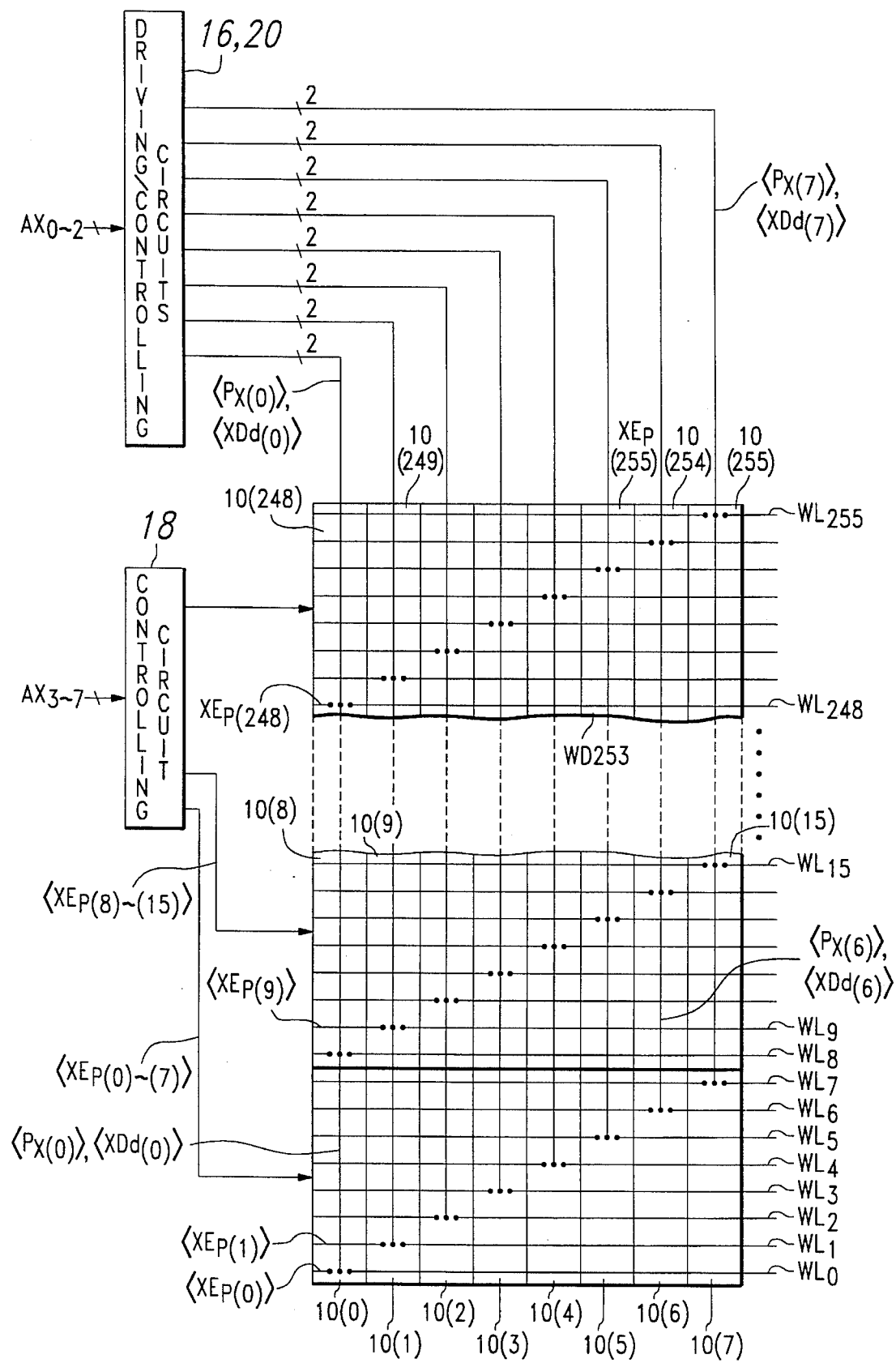
FIG. 4 is a schematic illustration of a typical arrangement for the word line drivers of the embodiment of the invention in a DRAM.

In FIG. 4, an example of arrangement of the word line drivers in said application example in a DRAM is shown. For example, when 256 word lines WL0–WL255 are provided in one memory cell, the same number (256) of word line drivers 10(0)–10(255) are arranged on the base terminal side of said word lines. Said 256 word line drivers 10(0)–10 (255) are grouped 8 each into 32 groups [10(0)–10(7)], [10(8)–10(15) ], . . . , [10(248)–10(255)].

In each group, for example, [10(0)–10(7)], eight word line drivers 10(0), 10(1), . . . 10(7) having the same width in the word line array direction are arranged in one column in the length direction of the word line. Also, in each word line driver 10(i), along with the base terminal of word line WLi being connected, output line <XEP(i)> corresponding to first output transistor controlling circuit 18 is connected from the opposite direction so as to abut said word line WLi, and output lines <PX(i)> and <XDd(i)> corresponding to second output transistor controlling circuit 20 and output transistor driving circuit 16 are connected from the direction at a right angle to word line WLi.

First output transistor controlling circuit 18 selects eight word line drivers, for example, [10(0)–10(7)] simultaneously or as a batch in group units. On the other hand, output transistor driving circuit 16 and second output transistor controlling, circuit 20 selects 32 word line drivers, for example, 10(0), 10(8), . . . 10(248) which are arranged in the identical position in each group simultaneously or as a batch. Therefore, only one word line driver 10(i) selected in first output transistor controlling circuit 18 (selected in the five high-order bits AX3–7 of row address signals AX0–7) and also selected in second output transistor controlling circuit 20 and output transistor driving circuit 16 (also selected in the three low-order bits AX0–2 of row address signals AX0–7) operates as noted above and executes driving and discharging of word line WLi.

Figure 5:
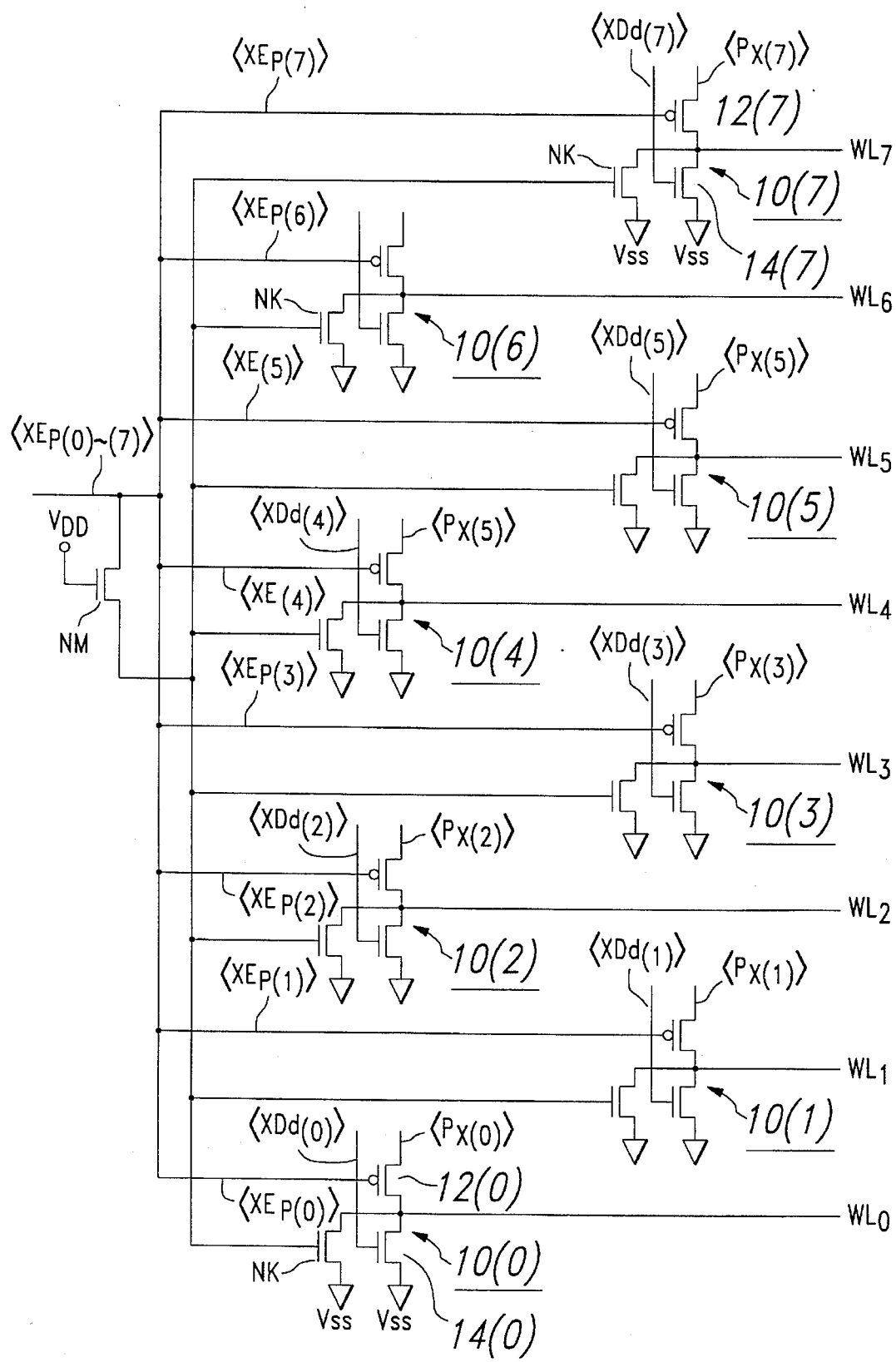
FIG. 5 is a circuit diagram showing an arrangement example of word line drivers [10(0)–10(7)] within one group in FIG. 4.
Figure 6:
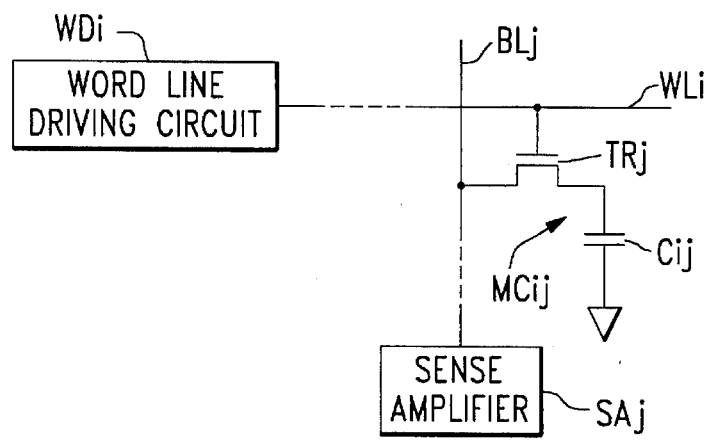
FIG. 6 is a block diagram showing the conventional connecting relationship between the memory cells, bit lines, and word lines in a DRAM.
Figure 7:
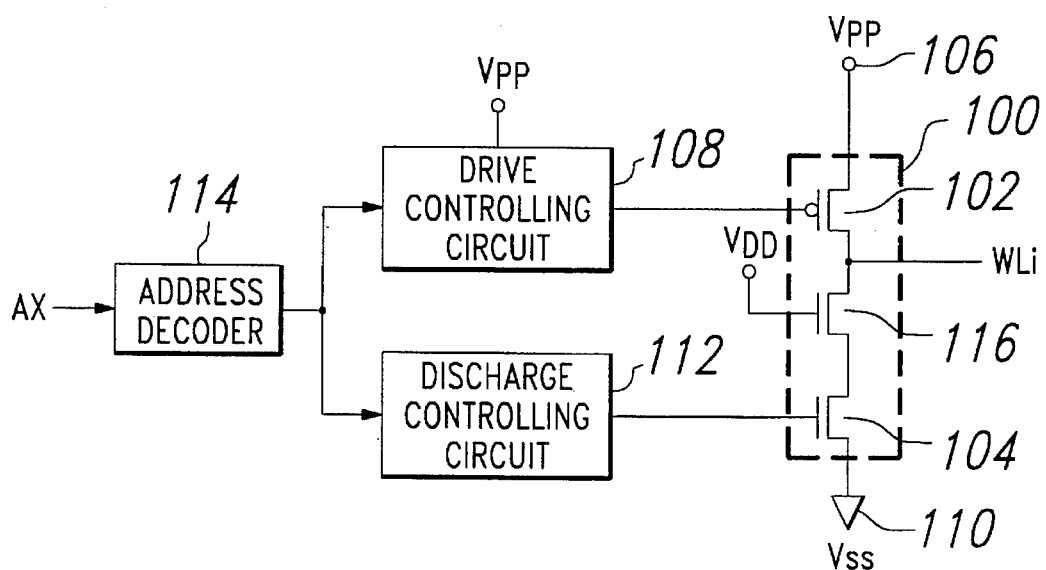
FIG. 7 is a block diagram showing a conventional word line driving circuit.

In FIG. 4, an example of arrangement of word line drivers [10(0)–10(7)] in FIG. 5 within the first group is shown. The arrangement of the other word line drivers within the groups [10(8)–10(15)], . . . , [10(248)–10(255)] are also the same.

In each word line driver 10(i) in FIG. 5, n-type MOS transistor NK for recovering the floating state of word line WLi is connected in parallel to n-type MOS transistor 14(i) for discharging. Output line <XEP(0)–(7)> of first output transistor controlling circuit 18 is connected to the gate terminal of said n-type MOS transistor NK via n-type MOS transistor NM for gate pressure resistance.

When output line <XEP(0)–(7)> is the VPP level, namely, when word line drivers 10(0)–10(7) are not selected by first output transistor controlling circuit 18, the drain terminal of n-type MOS transistor NM and the gate terminal of n-type MOS transistor NK are the (VSS-VTN) level, n-type MOS transistor NK is in the on state, and word line WLi is connected to the ground potential. Here, VTN is the threshold voltage of n-type MOS transistor NM.

When output line <PX(i)> of output transistor driving circuit (16) in one of the word line driver 10(i) rises to the VPP level in said state, output line <XDd(i)> of second output transistor controlling circuit 20 reaches the VSS level simultaneously, and n-type MOS transistor 14(i) of word line driver 10(i) takes on the off state. However, n-type MOS transistor NK is in the on state so word line WLi is maintained at the ground potential and does not enter the floating state, thus erroneous activation or erroneous operation of word line WLi is prevented.

Transistor NK for said floating prevention is the one that was used conventionally and can be eliminated as needed. The characteristic of this embodiment of the invention is in having made n-type MOS transistor (116) for hot electron prevention unnecessary in each word line driver 10(i). In this way, the layout area of each word line driver 10(i) becomes very small and can accommodate a narrowing of the pitch in word lines (WL) with margin. Also, in this embodiment, n-type MOS transistor 32 for hot electron prevention is provided to output transistor driving circuit 16 positioned at the peripheral part of the memory cell array, but this transistor 32 is shared with eight word line drivers within each group so only a few are necessary for the entire memory cell array.

In this embodiment, row address signal AX was made into 8 bits, three low-order bits AX0–2 were input into output transistor driving circuit 16 and second output transistor controlling circuit 20, and five high-order bits AX3–7 were input into first output transistor controlling circuit 18. However, the allotment of the address bits and bit count of the address signals are one example and optional allotments are possible.

Also, the circuit configuration shown in FIG. 3 is one example and various transformations and modifications are possible. For example, it is possible to replace the two n-type MOS transistors 32 and 34 with one p-type MOS transistor in switch circuit 28 of output transistor driving circuit 16. In such case, the logic of the second output signal XDb of voltage level converting circuit 26 is set opposite from that described in connection with the embodiment of FIG. 3.

Also, even in word line driver 10, it is possible to replace p-type MOS transistor 12 with n-type MOS transistor or another transistor, or replace n-type MOS transistor 14 with p-type MOS transistor or another transistor.

Furthermore, the timing and level of the voltage or the output signal of the first and second output transistor controlling circuits and output transistor driving circuit with respect to the first and second output transistors can be set optionally and even the potential for leading in the electric current and power source voltage for driving can be set to an optional level.

As explained above, according to the word line driving circuit of the present invention, it is possible to make the transistor for hot electron prevention unnecessary for the word line driver since the charge on the word line is discharged through the second transistor for discharging after discharging the charge on the word line to some extent through the first output transistor used for driving such that the layout area of the word line driver can be made small; thus, the layout area of the entire word line driving circuit can be made considerably smaller, and can accommodate narrowing in the pitch of the word lines with margin. Also, it is possible to effectively prevent ground noise since the charge on the word line is distributed and discharged on the different terminal side for leading in the electric current.

We claim:

1. A word line driving circuit for driving a word line in a memory array of a semiconductor memory device, wherein the word line is associated with a plurality of memory cells arranged in a row and having respective control terminals connected to the word line, said word line driving circuit comprising:

a first output transistor having first, second and control terminals, the first terminal of said first output transistor being connected to the word line;

a second output transistor having first, second and control terminals, the first terminal of said second output transistor being connected to the word line and the second terminal of said second output transistor being connected to a reference potential terminal for leading in electrical current;

an output transistor driving circuit connected to the second terminal of said first output transistor and providing voltage to the second terminal of said first output transistor during the time that said word line is to be driven for driving the word line and decreasing the voltage at the second terminal of said first output transistor to the potential for leading in electrical current after driving of said word line has ended;

a first control circuit connected to the control terminal of said first output transistor for turning on said first output transistor in order to drive said word line and returning said first output transistor to a non-conductive state after a first predetermined time following the ending of driving the word line;

a second control circuit connected to the control terminal of said second output transistor for rendering said second output transistor non-conductive during the time that said word line is being driven and turning on said second output transistor after a second predetermined time following the ending of driving the word line;

each of said output transistor driving circuit and said second control circuit being provided with a plurality of inputs for receiving in common a plurality of address signals as binary bits; and said first control circuit having a plurality of inputs for receiving a plurality of address signals as binary bits, the plurality of address signals received by the inputs of said first control circuit being different from the address signals received by the inputs of said output transistor driving circuit and said second control circuit but included in a common set of address signals therewith.

2. A word line driving circuit for driving a word line in a memory array of a semiconductor memory device, wherein the word line is associated with a plurality of memory cells arranged in a row and having respective control terminals connected to the word line, said word line driving circuit comprising:

a first output transistor having first, second and control terminals, the first terminal of said first output transistor being connected to the word line;

a second output transistor having first, second and control terminals, the first terminal of said second output transistor being connected to the word line and the second terminal of said second output transistor being connected to a reference potential terminal for leading in electrical current;

an output transistor driving circuit connected to the second terminal of said first output transistor and providing voltage to the second terminal of said first output transistor during the time that said word line is to be driven for driving the word line and decreasing the voltage at the second terminal of said first output transistor to the potential for leading in electrical current after driving of said word line has ended;

a first control circuit connected to the control terminal of said first output transistor for turning on said first output transistor in order to drive said word line and returning said first output transistor to a non-conductive state after a first predetermined time following the ending of driving the word line;

a second control circuit connected to the control terminal of said second output transistor for rendering said second output transistor non-conductive during the time that said word line is being driven and turning on said second output transistor after a second predetermined time following the ending of driving the word line;

each of said output transistor driving circuit and said second control circuit being provided with a plurality of inputs for receiving in common a plurality of address signals as binary bits;

said first control circuit having a plurality of inputs for receiving a plurality of address signals as binary bits, the plurality of address signals received by the inputs of said first control circuit being different from the address signals received by the inputs of said output transistor driving circuit and said second control circuit but included in a common set of address signals therewith; and the plurality of address signals applied to the inputs of said output transistor driving circuit and said second control circuit being least significant bits and the plurality of address signals received by the inputs of said first control signal being most significant bits in the set of address signals.

3. A word line driving circuit as set forth in claim 2, wherein the number of bits of the set of address signals received by the inputs of said output transistor driving circuit and said second control circuit is less than the number of bits of the set of address signals received by the inputs of said first control circuit.

4. A word line driving circuit for driving a word line in a memory array of a semiconductor memory device, wherein the word line is associated with a plurality of memory cells arranged in a row and having respective control terminals connected to the word line, said word line driving circuit comprising:

a first output transistor having first, second and control terminals, the first terminal of said first output transistor being connected to the word line;

a second output transistor having first, second and control terminals, the first terminal of said second output transistor being connected to the word line and the second terminal of said second output transistor being connected to a reference potential terminal for leading in electrical current;

an output transistor driving circuit connected to the second terminal of said first output transistor and providing voltage to the second terminal of said first output transistor during the time that said word line is to be driven for driving the word line and decreasing the voltage at the second terminal of said first output transistor to the potential for leading in electrical current after driving of said word line has ended;

a first control circuit connected to the control terminal of said output transistor for turning on said first output transistor in order to drive said word line and returning said first output transistor to a non-conductive state after a first predetermined time following the ending of driving the word line;

a second control circuit connected to the control terminal of said second output transistor for rendering said second output transistor non-conductive during the time that said word line is being driven and turning on said second output transistor after a second predetermined time following the ending of driving the word line;

each of said output transistor driving circuit and said second control circuit being provided with a plurality of inputs for receiving in common a plurality of address signals as binary bits;

said first control circuit having a plurality of inputs for receiving a plurality of address signals as binary bits, the plurality of address signals received by the inputs of said first control circuit being different from the address signals received by the inputs of said output transistor driving circuit and said second control circuit but included in a common set of address signals therewith;

said first control circuit comprising:
a first address decoder having inputs for receiving the plurality of address signals included in said set of address signals and having an output, and
a first voltage level converting circuit connected to said first address decoder for receiving the output therefrom and having an output connected to the control terminal of said first output transistor;

said output transistor driving circuit comprising:
a second address decoder common to said second control circuit and having inputs for receiving the plurality of address signals as applied to said output transistor driving circuit and said second control circuit and having an output,
a second voltage level converting circuit connected to the output of said second address decoder and having first and second outputs, and
a switching circuit connected to said second voltage level converting circuit and receiving the first and second outputs from said second voltage level converting circuit, said switching circuit having an output connected to the second terminal of said first output transistor; and said second control circuit including a delay circuit having an input connected to the output of said second address decoder and an output connected to the control terminal of said second output transistor.

5. A word line driving circuit as set forth in claim 4, wherein the output signal provided by the output of said second address decoder in response to a predetermined strobe signal drops from a high voltage level corresponding to a supply voltage to a low voltage level corresponding to a reference voltage when the logical value of the plurality of bits defined by the address signals received by the inputs of said second address decoder corresponds to the value representative of the particular word line row, the output signal from the output of said second address decoder returning to a high voltage level corresponding to the supply voltage after the second predetermined time corresponding to the completion of the driving of the word line.

6. A word line driving circuit as set forth in claim 4, wherein said switching circuit included in said output transistor driving circuit comprises a plurality of serially arranged transistors having respective first, second and control terminals and defining a transistor chain;

the transistor at one end of the transistor chain of said switching circuit having a control terminal of opposite polarity with respect to the control terminals of the remaining transistors included in the transistor chain; and the first and second outputs of said second voltage level converting circuit being respectively connected to the control terminal of opposite polarity of the transistor at one end of the transistor chain and to the control terminal of the transistor at the other end of the transistor chain.

* * * * *